(12) United States Patent
Tihanyi et al.

(10) Patent No.: US 6,225,643 B1
(45) Date of Patent: May 1, 2001

(54) SOI CELL AND METHOD FOR PRODUCING IT

(75) Inventors: Jenoe Tihanyi, Kirchheim; Helmut Strack, München, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/158,248

(22) Filed: Sep. 22, 1998

(30) Foreign Application Priority Data

Sep. 23, 1997 (DE) ................................ 197 41 972

(51) Int. Cl.[7] .................. H01L 29/04; H01L 31/036; H01L 29/76; H01L 31/112
(52) U.S. Cl. .................. 257/51; 257/66; 257/335; 257/347
(58) Field of Search .................. 257/51, 133, 139, 257/335–336, 345, 372, 374, 386, 394–396, 66, 347

(56) References Cited

U.S. PATENT DOCUMENTS

| 4,566,914 | 1/1986 | Hall | 438/294 |
|---|---|---|---|
| 4,769,687 | 9/1988 | Nakazato et al. | 257/557 |
| 4,778,775 | 10/1988 | Tzeng | 438/214 |
| 5,043,778 | 8/1991 | Teng et al. | 257/374 |
| 5,132,755 | 7/1992 | Ueno | 257/368 |
| 5,396,087 | 3/1995 | Baliga | 257/139 |
| 5,463,241 | 10/1995 | Kubo | 257/376 |
| 5,693,975 | 12/1997 | Lien | 257/374 |
| 5,949,116 | 9/1999 | Wen | 257/408 |

FOREIGN PATENT DOCUMENTS 4113756   10/1992   (DE) .

*Primary Examiner*—Ngân V. Ngô
(74) *Attorney, Agent, or Firm*—Herbert L. Lerner; Laurence A. Greenberg; Werner H. Stemer

(57) ABSTRACT

An SOI cell includes a semiconductor body having at least one insulator layer. A polycrystalline zone doped with a dopant of a first conductivity type is grown on the insulator layer. The polycrystalline zone is adjoined outside the region of the insulator layer by a semiconductor region, which is doped with the dopant of the first conduction type that has been diffused out of the polycrystalline zone. A dopant source having a dopant of a second conductivity type is also provided. A zone having the dopant of the second conductivity type is formed by diffusing the dopant out of the dopant source.

18 Claims, 2 Drawing Sheets

SOI CELL AND METHOD FOR PRODUCING IT

BACKGROUND OF THE INVENTION

Field of the Invention

The invention relates to a silicon on insulator (SOI) cell for power components having at least one insulator layer provided in a semiconductor body. A polycrystalline zone doped with a dopant of a first conductivity type is grown on the at least one insulator layer. The invention also relates to a method for producing such an SOI cell.

A semiconductor component controllable by a field effect is described in Published, Non-Prosecuted, German Patent Application DE 41 13 756 A1, in which an insulator layer adjoins a source zone and is disposed between the source zone and the main face opposite the source zone of the semiconductor body. The insulator layer is intended to prevent the undesired activation of parasitic bipolar structures.

From U.S. Pat. No. 5,396,087, an Insulated Gate Bipolar Transistor (IGBT) is known, in which an insulator layer embedded in the semiconductor body is intended to prevent electrical conduction between a base region and the field effect transistor and in particular to prevent an injection of minority charge carriers from the base region into the source of the field effect transistor.

It is accordingly familiar to one skilled in the art that thin insulator layers under a $n^+$ zone, for instance, can increase the reliability and robustness of MOSFET and IGBT cells. It is also known that sealing off an IGBT cell with an insulator layer in the direction of an $n^-$-conducting drain zone reduces the voltage drop in the on state, as is also the case for a so-called trench cell.

In general, however, the production of an embedded insulator layer is complicated and expensive and requires complicated process steps such as in the so-called SIMOX process or the direct wafer bonding process.

SUMMARY OF THE INVENTION

It is accordingly an object of the invention to provide a SOI cell and method for producing it, which overcome the above-mentioned disadvantages of the prior art methods and devices of this general type, and which can be produced in a simple, inexpensive manner.

With the foregoing and other objects in view there is provided, in accordance with the invention, a silicon on insulator (SOI) cell, including: a semiconductor body; at least one insulator layer disposed in the semiconductor body and having an edge; a polycrystalline zone doped with a dopant of a first conductivity type grown on the at least one insulator layer; and a semiconductor region adjoining the polycrystalline zone and located outside a region of the at least one insulator layer or just inside the edge of the at least one insulator layer, the semiconductor region doped with the dopant of the first conductivity type by diffusion from the polycrystalline zone.

The object is attained in an SOI cell of the type recited at the outset according to the invention in that adjoining the polycrystalline zone, which has been grown over the buried insulator layer, in a semiconductor region, located outside the region of the insulator layer or just inside the edge of the insulator layer, and the semiconductor region is doped by diffusion from the polycrystalline zone with the dopant of the first conductivity type.

The SOI cell of the invention is also distinguished in that a dopant source having a dopant of a second conduction type, opposite the first, is introduced into the semiconductor body by ion implantation. Optionally, the dopant source is disposed in the semiconductor body above a further insulator layer. The semiconductor region located outside the region of the insulator layer and doped with the dopant of the first conduction type is preferably n-conducting. Accordingly, the dopant source is doped with p-conducting dopant, such as boron.

Upon a heat treatment, the n dopant, such as phosphorus, thus leaves the polycrystalline zone above the insulator layer by diffusion and penetrates the adjacent monocrystalline semiconductor material, where it forms an n-conducting zone. The p dopant is made to practically "float away" from the dopant source as a consequence of its substantially higher coefficient of diffusion, so that a substantially more-extensive p zone is created in the monocrystalline semiconductor material of the otherwise n-conducting semiconductor body. An npn structure with an SOI cell can thus be created in a relatively simple way.

The dopant source can be provided for instance beneath an insulator layer or between two insulator layers, that is, above a further insulator layer, as noted above. In the first instance, the dopant source is located in the monocrystalline semiconductor material, while in the second case it is disposed in the polycrystalline semiconductor material.

An essential feature of the invention is that the semiconductor region of the first conduction type, created by the diffusion out of the polycrystalline layer above the insulator layer, which region is optionally augmented with a semiconductor zone of the other conduction type created with the dopant source.

In accordance with an added feature of the invention, the polycrystalline zone is implanted with arsenic in a dose of approximately $10^{15}$ cm$^{-2}$.

In accordance with an additional feature of the invention, the first insulator layer and the second insulator layer are made from a material selected from the group consisting of silicon dioxide and silicon nitride.

In accordance with another feature of the invention, the first insulator layer and the second insulator layer have a layer thickness of approximately 40 nm.

In accordance with a further added feature of the invention, one of the first insulator layer and the second insulator layer is completely buried under the other of the first insulator layer and the second insulator layer.

In accordance with a further additional feature of the invention, the polycrystalline zone has a layer thickness of approximately 1 $\mu$m.

In accordance with yet another feature of the invention, there is a further polycrystalline zone disposed on the second insulator layer and having a layer thickness of approximately 1 $\mu$m.

With the foregoing and other objects in view there is provided, in accordance with the invention, a method for producing an SOI cell, which includes: forming a semiconductor body; applying an insulator layer on the semiconductor body; growing a monocrystalline layer on the semiconductor body; growing a polycrystalline zone on the insulator layer; implanting the polycrystalline zone with a dopant of a first conductivity type; and heat-treating the polycrystalline zone for laterally diffusing the dopant out of the polycrystalline zone into the monocrystalline layer for forming a doped monocrystalline zone in the monocyrstalline layer.

In accordance with a concomitant feature of the invention, there are the steps of forming a dopant source with a dopant of a second conductivity type, opposite the first conductivity type, in the semiconductor body before the heat-treating step; and diffusing out of the dopant source the dopant of the second conductivity type into the monocrystalline layer during the heat-treating step.

In the method for producing the SOI cell, so-called marker insulator layers of silicon dioxide or silicon nitride are applied in structured form to a n-conducting semiconductor body for instance, optionally also an $n^+$-$n^-$-conducting semiconductor body or a $p^+$-n-conducting semiconductor body for IGBTs. A $p^+$ dopant source is also implanted in the semiconductor body.

Next, onto the thus-treated semiconductor body, a thin epitaxial layer is applied, with a layer thickness of approximately 0.1 to 2 $\mu$m. In the process, polycrystalline silicon grows above the marker insulator layers. Outside the layers, however, the silicon is deposited in monocrystalline form.

Next, the polycrystalline silicon, optionally after structuring, is provided with n dopant by implantation. Because of the high diffusion speed a virtually uniform dopant concentration occurs.

After the diffusion of the n dopant out of the polycrystalline silicon into the adjacent monocrystalline silicon and of the p dopant out of the $p^+$ dopant source, a FET in an SOI cell is created, whose threshold voltage is determined by the surface concentration of the p doping on the gate oxide silicon surface and is controllable with conventional methods.

This is then followed by a conventional gate structure production, contact hole etching, metallizing, and passivation. Edge shaping can also be done in the usual way.

Advantageously, the implanted dopant source can be made in a self-adjusting fashion with regard to the marker insulator layers located above it. This is possible for instance using a modified LOCOS process, in which after the LOCOS oxidation, the thick oxide is etched away, and the silicon nitride is removed with phosphoric acid. The nitride oxide then located beneath the silicon nitride forms the marker insulator layer.

In the version of an SOI cell with two insulator layers one above the other, the procedure can be as follows.

Over an $n^-$ or $n^+$-$n^-$-conducting semiconductor body, for instance, optionally with an epitaxial layer, a first marker insulator layer, for instance of silicon nitride and with a layer thickness of approximately 40 nm, is formed and structured. On the thus-produced configuration, an epitaxial layer is deposited, which for instance is $n^-$-doped and 1 $\mu$m thick. The epitaxial layer grows in polycrystalline form over the marker insulator layer and elsewhere grows in monocrystalline form. Into the thus-created polycrystalline zone, boron is implanted, in a dose of from $10^{14}$ to $10^{15}$ cm$^{-2}$ into the thus-created polycrystalline zone.

Next, over the polycrystalline zone, a second marker insulator layer is deposited. A further epitaxial layer, which again may be approximately 1 $\mu$m thick, grows in polycrystalline form on the second marker insulator layer and elsewhere in monocrystalline form.

This is then followed by the usual process steps such as gate oxide production, deposition of the polycrystalline gate layer and its structuring, implantation of the source for instance with arsenic in a dose of approximately $10^{15}$ cm$^{-2}$, deposition of an intermediate oxide layer, contact hole etching, and metallizing with structuring.

During high-temperature steps, after the source implantation, the arsenic is distributed uniformly in the upper polycrystalline zone and penetrates only slightly into the monocrystalline silicon in the lateral direction. The p-conducting dopant, that is, the boron of the dopant source, diffuses more strongly out of the intermediate zone located between the two insulator layers and thus forms the channel region.

However, it might also be thought of to implant the channel region even before the polycrystalline silicon is deposited. Other features which are considered as characteristic for the invention are set forth in the appended claims.

Although the invention is illustrated and described herein as embodied in a SOI cell and a method for producing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
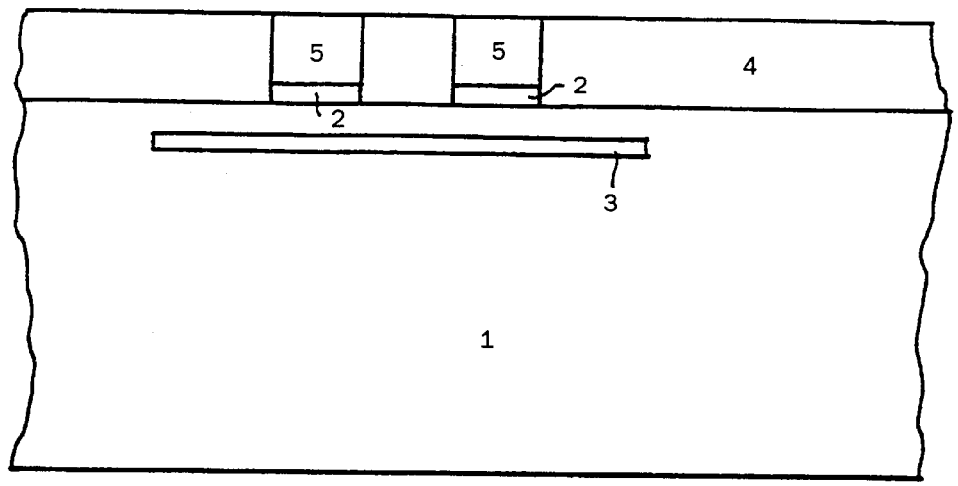
FIGS. 1 and 2 are sectional views showing a first exemplary embodiment of an SOI cell having only a single insulator layer according to the invention.

In the drawings, components corresponding to one another are each identified by the same reference numerals. Referring now to the figures of the drawing in detail and first, particularly, to FIG. 1 thereof, there is shown a n-conducting semiconductor body 1, which may optionally also be replaced with a $n^+$-$n^-$ or, for an IGBT, a $p^+$-n-conducting semiconductor body 1. Onto the semiconductor body 1, marker insulator layers 2, for instance of silicon dioxide or silicon nitride, are applied in structured form. A $p^+$ dopant source 3 is also created, which can be done by implantation of boron, for instance.

Next, a thin epitaxial layer 4 of silicon is deposited, with a layer thickness of 0.1 to 2 $\mu$m, for instance. The epitaxial layer 4 grows in monocrystalline form on the semiconductor body 1 and in polycrystalline form on the marker insulator layers 2, thus creating polycrystalline zones 5 on the marker insulator layers 2.

The polycrystalline zones 5 are then highly doped by implantation, for instance with arsenic, and as a consequence of the high diffusion speed a virtually uniform doping is present. After the arsenic has diffused out of the polycrystalline zones 5, source zones 6 are thus created, while the diffusion out of the dopant source 3 furnishes a channel region 7 (FIG. 2) with a pn junction 8 to the semiconductor body 1.

Figure 2:
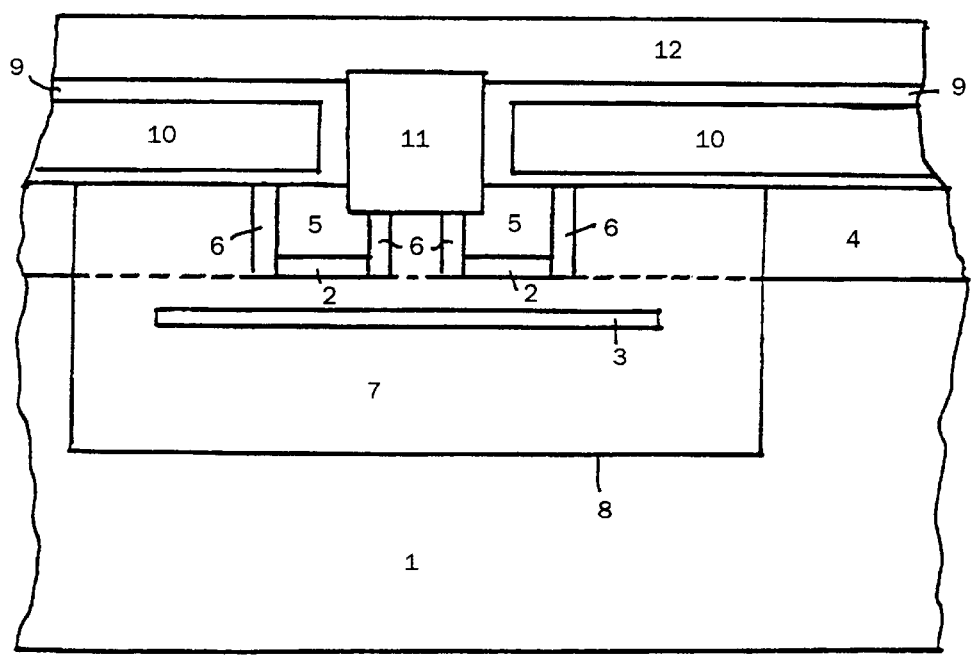

The method steps that now follow are of the usual type. An application of a gate silicon oxide layer, growth of a further $n^+$-doped polycrystalline layer, contact hole etching, growth of a further silicon dioxide layer over the surface of the $n^+$-doped polycrystalline silicon layer, and metallizing, so that overall the SOI cell is formed as shown in FIG. 2. The SIO cell has insulator layers 9, an $n^+$-doped polycrystalline silicon layer 10 acting as a gate contacter, and metallizings 11, 12.

In the SOI cell thus created, passivations and edge shapings can be done in the usual way.

The dopant source 3 can optionally also be embodied in a self-adjusting fashion to the marker insulator layer 2. As has already been noted above, this is possible by using a modified LOCOS process, in which after the LOCOS oxidation the thick oxide is etched away, and the silicon nitride is removed with phosphoric acid so that the nitride oxide then located beneath the silicon nitride forms the marker insulator layer.

Figure 3:
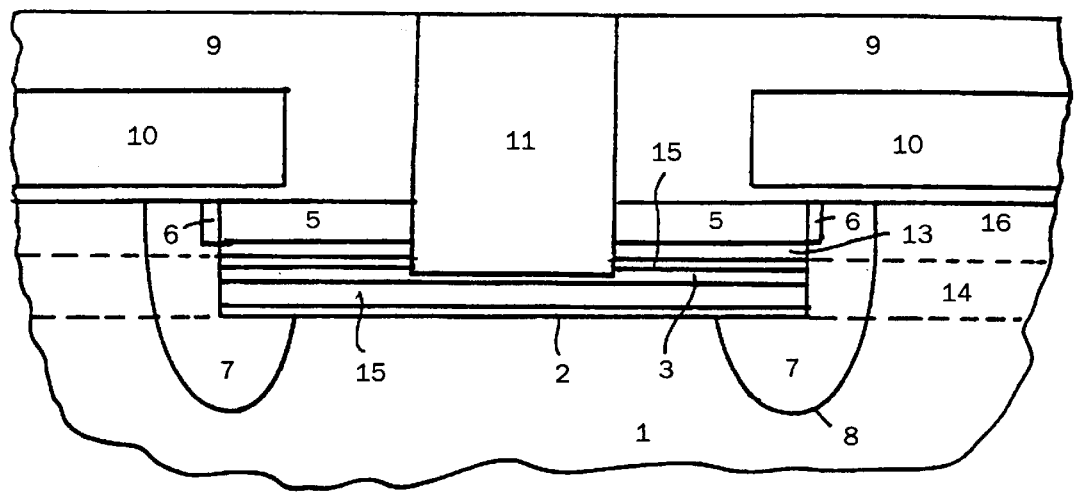
FIGS. 3 and 4 are sectional view through the SOI cell in a second and third exemplary embodiment, respectively, each with two insulator layers.

FIG. 3 shows a section through a further exemplary embodiment of the SOI cell of the invention. Here, a further insulator layer 13 is provided in addition to the insulator layer 2.

To produce the SOI cell of FIG. 3, a procedure that is similar to that of the exemplary embodiment of FIGS. 1 and 2 is used. Over the n-conducting semiconductor body 1, which may optionally also be replaced with an n-conducting semiconductor body or an n-conducting semiconductor body together with an n-conducting semiconductor body together with an n⁻-conducting epitaxial layer, the marker insulator layer 2 is first applied, with a layer thickness of 40 nm, for instance. Next, an n-doped first epitaxial layer 14 is deposited approximately 1 μm thick above the marker insulator layer 2, and grows in polycrystalline form and otherwise is monocrystalline, thus creating a polycrystalline zone 15. Into the polycrystalline zone 15, the dopant source 3 is implanted with boron in a dose from $10^{14}$ to $10^{15}$ cm$^{-2}$. The second marker insulator layer 13 is then created above the polycrystalline zone 15. Over the thus-obtained configuration, a further epitaxial layer 16 of silicon, which may likewise be about 1 μm thick, is deposited. The further epitaxial layer 16 grows in polycrystalline form over the second marker insulator layer 13, there creating the polycrystalline zones 5. Conventional process steps then follow, as already explained above in conjunction with FIG. 2, in order to produce the n⁺-conducting polycrystalline silicon layer 10 as a gate electrode in the insulator layer 9 and the metallizing 11 as a source electrode.

The polycrystalline zones 5 are implanted for instance with arsenic in a dose of $10^{15}$ cm$^{-2}$, so that after a high-temperature step the zones 6 are formed from the zones 5, and the zones 7 are formed from the dopant source 3.

Figure 4:
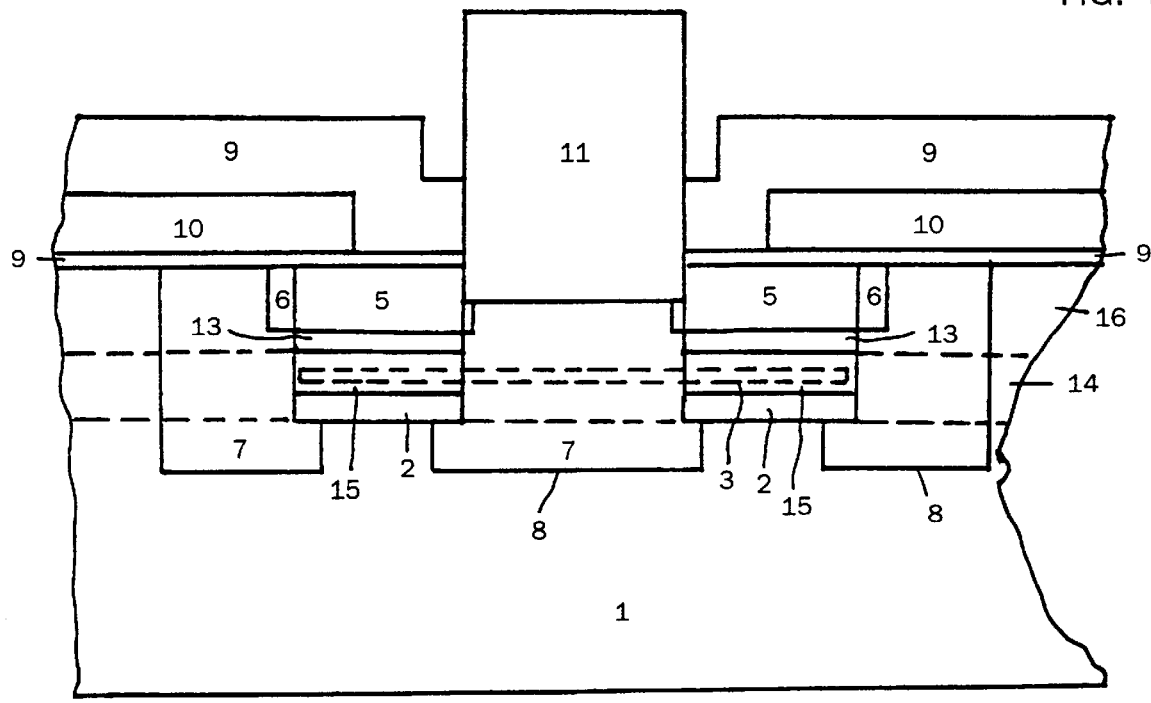

After the ion implantation, the arsenic is distributed uniformly in the zones 5, since the diffusion in the polycrystalline material is substantially greater, and during the high-temperature step penetrates only slightly into the adjacent monocrystalline material for forming the zones 6. The boron diffuses substantially more strongly out of the dopant source 3 and thus forms the p-conducting zones 7, which in the SOI cell shown form a channel zone. The drain electrode is mounted on the semiconductor body 1. A further exemplary embodiment of the SOI cell of the invention is shown in FIG. 4. In the exemplary embodiment, both insulator layers 2, 13 are buried annularly and completely ("buried insulator"), which has the advantage of an arbitrarily highly doped p⁺-region from the dopant source 3, thus making the latch-up strength especially high, and largely eliminating parasitic bipolar transistors.

What is claimed is:

1. A silicon-on-insulator cell, comprising:

a semiconductor body;

a first insulator layer and a second insulator layer disposed in said semiconductor body, made from a material selected from the group consisting of silicon dioxide and silicon nitride and having a layer thickness of approximately 40 nm;

a polycrystalline zone doped with a dopant of a first conductivity type grown on at least one of said first insulator layer and said second insulator layer;

a semiconductor region adjoining said polycrystalline zone and located outside a region of said first insulator layer and said second insulator layer, said semiconductor region doped with said dopant of said first conductivity type by diffusion from said polycrystalline zone; and a dopant source having a dopant of a second conductivity type, opposite said first conductivity type, said dopant source being introduced into said semiconductor body by ion implantation and being disposed in said semiconductor body above said second insulator layer.

2. A silicon-on-insulator cell, comprising:

a semiconductor body;

a first insulator layer and a second insulator layer disposed in said semiconductor body, one of said first insulator layer and said second insulator layer being completely buried under the other of said first insulator layer and said second insulator layer;

a polycrystalline zone doped with a dopant of a first conductivity type grown on at least one of said first insulator layer and said second insulator layer;

a semiconductor region adjoining said polycrystalline zone and located outside a region of said first insulator layer and said second insulator layer, said semiconductor region doped with said dopant of said first conductivity type by diffusion from said polycrystalline zone; and a dopant source having a dopant of a second conductivity type, opposite said first conductivity type, said dopant source being introduced into said semiconductor body by ion implantation and being disposed in said semiconductor body above said second insulator layer.

3. A silicon-on-insulator cell, comprising:

a semiconductor body;

a first insulator layer and a second insulator layer disposed in said semiconductor body;

a polycrystalline zone doped with a dopant of a first conductivity type grown on at least one of said first insulator layer and said second insulator layer;

a further polycrystalline zone disposed on said second insulator layer and having a layer thickness of approximately 1 μm;

a semiconductor region adjoining said polycrystalline zone and located outside a region of said first insulator layer and said second insulator layer, said semiconductor region doped with said dopant of said first conductivity type by diffusion from said polycrystalline zone; and a dopant source having a dopant of a second conductivity type, opposite said first conductivity type, said dopant source being introduced into said semiconductor body by ion implantation and being disposed in said semiconductor body above said second insulator layer.

4. The SILICON-ON-INSULATOR cell according to claim 1, wherein said first conductivity type is an n conductivity type.

5. The SILICON-ON-INSULATOR cell according to claim 1, wherein said dopant source is implanted with boron in a dose of from $10^{14}$ to $10^{15}$ cm$^{-2}$.

6. The SILICON-ON-INSULATOR cell according to claim 1, wherein said polycrystalline zone is implanted with arsenic in a dose of approximately $10^{15}$ cm$^{-2}$.

7. The SILICON-ON-INSULATOR cell according to claim 1, wherein said first insulator layer and said second insulator layer are made from a material selected from the group consisting of silicon nitride and silicon dioxide.

8. The SILICON-ON-INSULATOR cell according to claim 1, wherein said polycrystalline zone has a layer thickness of approximately 1 µm.

9. The SILICON-ON-INSULATOR cell according to claim 2, wherein said first conductivity type is an n conductivity type.

10. The SILICON-ON-INSULATOR cell according to claim 2, wherein said dopant source is implanted with boron in a dose of from $10^{14}$ to $10^{15}$ cm$^{-2}$.

11. The SILICON-ON-INSULATOR cell according to claim 2, wherein said polycrystalline zone is implanted with arsenic in a dose of approximately $10^{15}$ cm$^{-2}$.

12. The SILICON-ON-INSULATOR cell according to claim 2, wherein said first insulator layer and said second insulator layer are made from a material selected from the group consisting of silicon nitride and silicon dioxide.

13. The SILICON-ON-INSULATOR cell according to claim 2, wherein said polycrystalline zone has a layer thickness of approximately 1 µm.

14. The SILICON-ON-INSULATOR cell according to claim 3, wherein said first conductivity type is an n conductivity type.

15. The SILICON-ON-INSULATOR cell according to claim 3, wherein said dopant source is implanted with boron in a dose of from $10^{14}$ to $10^{15}$ cm$^{-2}$.

16. The SILICON-ON-INSULATOR cell according to claim 3, wherein said polycrystalline zone is implanted with arsenic in a dose of approximately $10^{15}$ cm$^{-2}$.

17. The SILICON-ON-INSULATOR cell according to claim 3, wherein said first insulator layer and said second insulator layer are made from a material selected from the group consisting of silicon nitride and silicon dioxide.

18. The SILICON-ON-INSULATOR cell according to claim 3, wherein said polycrystalline zone has a layer thickness of approximately 1 µm.

* * * * *